(12) United States Patent
Stemmer

(10) Patent No.: US 9,317,917 B2
(45) Date of Patent: Apr. 19, 2016

(54) METHOD, RECONSTRUCTION DEVICE, AND MAGNETIC RESONANCE APPARATUS FOR RECONSTRUCTING MAGNETIC RESONANCE RAW DATA

(71) Applicant: Siemens Aktiengesellschaft, Munich (DE)

(72) Inventor: Alto Stemmer, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 14/587,101

(22) Filed: Dec. 31, 2014

(65) Prior Publication Data

US 2015/0187073 A1    Jul. 2, 2015

(30) Foreign Application Priority Data

Jan. 2, 2014 (DE) .................. 10 2014 200 006

(51) Int. Cl.
*G06K 9/00* (2006.01)
*G06T 7/00* (2006.01)
*G06T 5/00* (2006.01)
*G01R 33/561* (2006.01)
*G01R 33/48* (2006.01)

(52) U.S. Cl.
CPC .......... *G06T 7/0012* (2013.01); *G01R 33/5611* (2013.01); *G06T 5/001* (2013.01); *G01R 33/4824* (2013.01)

(58) Field of Classification Search
CPC ............... G06T 2207/10088; G06T 2211/416; G06T 11/00; A61B 8/5207; G01R 33/4818; G01R 33/482; G01R 33/4822; G01R 33/4824; G01R 33/4826
See application file for complete search history.

(56) References Cited

U.S. PATENT DOCUMENTS 7,840,045 B2 * 11/2010 Guo .................... G01R 33/5611
                                                                324/307
8,155,419 B2 *  4/2012 Haider ................. G01R 33/482
                                                                382/131

(Continued)

OTHER PUBLICATIONS

Kholmovski et al. GARSE: Generalized Autocalibrating Reconstruction for Sensitivity Encoded MRI; Proc. Intl .Soc .Magn. Reson. Med., vol. 13, p. 2672; 13; (2005).

(Continued)

*Primary Examiner* — Avinash Yentrapati
(74) *Attorney, Agent, or Firm* — Schiff Hardin LLP

(57) ABSTRACT

In a method and a reconstruction device for reconstructing an image from MR raw data acquired with multiple coils and entered at sample points on a grid in k-space, the sample points are arranged on data entry trajectories, respectively, along one-dimensional edges in an equidistant grid dimension characteristic for the respective edge. If raw data were acquired at all sample points, k-space would be sufficiently scanned, but the raw data are entered only on a portion of the sample points so that sufficient scanning exists only in an internal region of k-space, with undersampling existing in an external region of k-space. Reconstruction of the missing raw data is performed by reconstructing raw data for a specific coil for the non-sampled sample points in the internal region using the raw data acquired with that coil for other sample points in the internal region, without using raw data acquired with other coils, and for the non-sampled sample points in the external region, using the raw data acquired for the internal region, as well as reconstructed raw data, and using raw data acquired with different coils.

15 Claims, 6 Drawing Sheets

(56) References Cited

U.S. PATENT DOCUMENTS

| | | | | |
|---|---|---|---|---|
| 8,570,034 | B2* | 10/2013 | Stemmer | G01R 33/246 324/307 |
| 2008/0187196 | A1* | 8/2008 | Hu | G01R 33/5611 382/128 |
| 2009/0238430 | A1* | 9/2009 | Haider | G01R 33/482 382/131 |
| 2010/0237864 | A1* | 9/2010 | Stemmer | G01R 33/246 324/309 |
| 2010/0237865 | A1* | 9/2010 | Stemmer | G01R 33/5611 324/309 |
| 2013/0123611 | A1* | 5/2013 | Riederer | G01R 33/4818 600/419 |

OTHER PUBLICATIONS

Griswold et al: "Generalized Autocalibrating Partially Parallel Acquisitions (GRAPPA)", Magnetic Resonance in Medicine vol. 47, 1202-1210,( 2002;).

Axel et al.: "Linogram reconstruction for magnetic resonance imaging(MRI)", in: IEEE Transactions on Medical Imaging, vol. 9, issue 4, pp. 447-449; (1990).

Griswold et al.: "Direct Parallel Imaging Reconstruction of radially Sampled Data using GRAPPA with relative shifts", in: Proc. Intl. Soc. Mag. Reson. Med., vol. 11, p. 2349; (2003).

Seiberlich: "Non-Cartesian Parallel Imaging", Konferenzbeitrag; Conference Contribution (2008).

Feng et al. "Golden-Angle Radial Sparse Parallel MRI: Combination of Compressed Sensing, Parallel Imaging, and Golden-Angle Radial Sampling for Fast and Flexible Dynamic Volumetric MRI" Magnetic Resonance in Medicine; vol. 72; pp. 707-717; (2014).

Gai N. et al. "Elimination of Nyquist Ghosts in MRI by using Fast Linogram Imaging"; Technical Note, J. Magn. Reson. Imaging; vol. 7; No. 6; pp. 1166-1169; (1997).

Wajer; "Non-Cartesian MRI scan time reduction through sparse sampling"; Dissertation; TU Delft; pp. 1-2; (2001).

Gai et al.: "A Dual Approach to Linogram Imaging for MRI", vol. 38,pp. 337-341,( 1997).

\* cited by examiner

METHOD, RECONSTRUCTION DEVICE, AND MAGNETIC RESONANCE APPARATUS FOR RECONSTRUCTING MAGNETIC RESONANCE RAW DATA

BACKGROUND OF THE INVENTION

1. Field of the Invention

The invention relates to a method of reconstructing raw data to produce magnetic resonance image data of an object under examination, as well as a method of producing magnetic resonance image data of an object under examination based on raw data acquired by a magnetic resonance system, using such a reconstruction method. Furthermore, the invention relates to a reconstruction device for reconstructing raw data to produce magnetic resonance image data of an object under examination, as well as a magnetic resonance system having such a reconstruction device.

2. Description of the Prior Art

In a magnetic resonance system, the subject to be examined is exposed by a base field magnet system to a relatively high basic field magnetic field, for example, of 1.5 Tesla, 3 Tesla or 7 Tesla. After applying the basic field, nuclei in the object under examination align along the field with a non-vanishing nuclear magnetic dipole moment, frequently also called spin. This collective performance of the spin system is described as macroscopic "magnetization". Macroscopic magnetization is the vector sum of all microscopic magnetic moments at a specific location in the object. In addition to the basic field, a gradient system, superimposes a magnetic field gradient thereon, allowing the magnetic resonance frequency (Larmor frequency) of nuclear spins at a respective location to be determined. By appropriate antenna devices, radio frequency excitation signals (RF pulses) are emitted via a radio frequency transmission system, which result in the nuclear spins of specific nuclei being resonantly excited (i.e., at the Larmor frequency that exists at the specific location) so as to be deflected by a defined flip angle with respect to the magnetic field lines of the basic magnetic field.

If such an RF pulse has an effect on spins that are already excited, they can be flipped to a different angular position, or even forced back to an original position parallel to the basic magnetic field. In the process of relaxing the excited nuclear spins, radio frequency signals (magnetic resonance signals) are resonantly emitted, which are received by an appropriate receiving antenna (also called magnetic resonance coils). The received signals are subsequently demodulated and digitized and processed as "raw data". The acquisition of magnetic resonance signals is performed in the spatial frequency domain, called "k-space". For this purpose, the acquired raw data are entered into a memory organized as k-space, at respective sample points in k-space along a trajectory or path, comprised of sample points, that is defined by the combination of the gradients that are activated during readout. In addition, the RF pulses have to be emitted in temporally appropriate coordination. After further procedural steps, which usually depend also on the acquisition method, the desired image data can be reconstructed from the raw data thus acquired, by a two-dimensional Fourier transformation. It is also possible to excite and read, in a defined manner, three-dimensional volumes, wherein after further procedural steps the raw data are entered into a memory organized as three-dimensional k-space. Correspondingly, it is possible to reconstruct a three-dimensional image data volume by a three-dimensional Fourier transformation.

Typically, to control a magnetic resonance imaging system, specific predetermined pulse sequences, i.e., successions of defined RF pulses, as well as gradient pulses in different directions and readout windows, are used for measurements, while the receiving antenna are set for reception and the magnetic resonance data are received and processed. By a measurement protocol, these sequences are parameterized in advance for a desired examination, for example, to obtain a specific contrast of calculated images. In addition, the measurement protocol may include further control data for the measurement. A large number of magnetic resonance sequence techniques exist, based on which pulse sequences can be constructed. One of the great challenges of the future development of magnetic resonance imaging (MR imaging) is to accelerate the data acquisition in such magnetic resonance sequence techniques without significantly compromising resolution, contrast and artifact susceptibility.

Current clinical MR imaging is almost exclusively based on Cartesian or rectilinear imaging, in which the scanned k-space points (i.e., the sample points in the k-space where raw data are entered) are located on the grid points of a rectangular grid or screen. It is possible to accelerate significantly such clinical imaging using parallel imaging methods. In parallel MR imaging, data acquisition is reduced by not acquiring a portion of the lines of the grid that are actually required for reconstructing a non-convolving image in k-space. These missing lines are later substituted during image reconstruction in k-space, or the artifacts that result from such undersampling are removed from k-space. To use the parallel imaging methods, it is required to receive the radio frequency signals with multiple receiving coils (antenna), and the spatial sensitivity of the individual receiving coils has to be known. The spatial sensitivity of the individual receiving coils is calculated from coil calibration data. Usually, the coil calibration data has to be sufficiently scanned. Because of the fact that the spatial sensitivities vary gradually, the coil calibration data generally requires a low spatial resolution. In general, the coil calibration data has to be re-measured for each patient. One of the most important parallel imaging methods is the GRAPPA method, which is described, for example, in the article "Generalized Autocalibrating Partially Parallel Acquisitions (GRAPPA)" by Marc Griswold et al., published in Magnetic Resonance in Medicine 47, 2002, pp. 1202 to 1210. The "missing" raw data $s_i(k_y,k_x)$ of the coil i at the k-space position $k=(k_y,k_x)$ are calculated or interpolated with the k-space coordinates $(k_y,k_x)$ for which no data was acquired as a linear combination of all measured data points in a specified vicinity or neighborhood $\Omega_{(ky,kz)}$ of the missing sample points:

$$s_i(k_y, k_x) = \sum_{j=1}^{N_c} \sum_{(q_y,q_x)\in\Omega_{(ky,kx)}} n_{i,(k_y,k_x)}(j, q_y, q_x) s_j(q_y, q_x) \qquad (1)$$

wherein i and j and the indices for the individual receiving coils used in parallel measurements, and respectively extend from 1 to $N_c$, the maximum of receiving coils used. The external (first) sum in the formula (1) integrates all receiving coils, the internal (second) sum integrates all "measured" sample points on which raw data was acquired and which are located in a definite neighborhood $\Omega_{(ky,kz)}$ of the respectively "missing" sample points with the k-space coordinates $(k_y,k_x)$. $s_j(q_y,q_x)$ is the respective signal (i.e., the raw data acquired there) measured by the j-th receiving coil at the sample point with the k-space coordinates $(q_y,q_x)$. $n_{i,(ky,kx)}$ are the complex linear factors which assess the individual data points measured in the vicinity $\Omega_{(ky,kz)}$, and which are initially unknown.

The index $\{i,(k_y,k_x)\}$ indicates that in general a separate set of linear factors is required not only for each coil i but also for each unmeasured data point with the coordinates $(k_y,k_x)$.

The basis of this method is that the coefficients or weighting factors $n_{i,(k_y,k_x)}$ (subsequently also called "GRAPPA weights") in the formula (1) for rectangular imaging are independent of the location $(k_y,k_x)$ of the sample point on the grid, and depend only on the distances to the respective neighboring sample points to be considered:

$$s_i(k_y, k_x) = \sum_{j=1}^{N_c}\sum_{l=0}^{N_y-1}\sum_{m=0}^{N_x-1} n_i(j,l,m)s_j\left(k_y+(Al-l_0)\Delta k_y, k_x+\left(m-\frac{N_x}{2}\right)\Delta k_x\right) \quad (3)$$

wherein $\Delta k_y$ is the grid spacing (the grid dimensions) between adjacent sample points in the phase coding direction, $\Delta k_x$ is the grid spacing between adjacent sample points in the frequency coding direction, and A is the acceleration factor, l and m are control variables of the neighboring sample points. $l_0$ is selected so that all sample points were measured on the right side of equation (3) and involve neighboring sample points of $s_i$. ni, in turn, involve the complex linear factors, which estimate the respectively measured data points in the vicinity and which are initially unknown. In equation (3), the rectangular vicinity of each unmeasured data point $N_x \times N_y$ is composed of data points that were individually acquired (detected) with $N_c$ different component coils. Because of the fact that on the left side of equation (3), the unmeasured data for each component coil are calculated separately and the linear factors for various component coils are different, a total of $N_{unknown}=N_c \cdot N_y \cdot N_x \cdot N_C$ complex GRAPPA weights are required for reconstructing the unmeasured data. The GRAPPA weights are obtained by measuring a second data set, called the "coil calibration data set". This coil calibration data set is completely (i.e., adequately according to the Nyquist theorem) scanned or measured. Because of the complete scanning process, the raw data $s_i(k_y,k_x)$ on the left side of equation (3) as well as the raw data $s_j(q_y,q_x)$ on the right side of equation (3) are known. If the coil calibration data set has at least as many data points as unknown GRAPPA weights are available, it is possible to calculate the GRAPPA weights. For this purpose, it is easiest to write equation (3) for each component coils in matrix format:

$$s_i = G \cdot n_i \quad (2)$$

In this format, $n_i$ is a column vector of the length $N_y \cdot N_x \cdot N_C$ the components of which include the required GRAPPA weights for coil i. The column vector $s_i$ is a vector consisting of M data points of the coil calibration data set for which all neighbors in the selected vicinity have also been measured. Consequently, the column vector $s_i$ has the length M and includes only data points of the selected component coil i. As a result, G involves an $M \times N_y \cdot N_x \cdot N_C$ matrix. The elements of the matrix G consist of measured data points. Consequently, the m line of matrix G consists of the total $N_y \cdot N_x \cdot N_C$ data points in the rectangular vicinity of the m data point according to equation (3).

Usually, it is necessary to measure so many sample points that the equation system is overdetermined. Subsequently, this equation system is resolved with standard methods in terms of the smallest squared deviation.

In addition to Cartesian imaging, radial imaging is gaining increasing significance, primarily because of its relative insensitivity to movement of the subject. In radial imaging, data acquisition is performed along radial spokes that proceed through the k-space center. The relative insensitivity to movement is because of the repeated acquisition of central k-space. A primary disadvantage of radial imaging is that because of the oversampling of the central k-space region, the required data volume for reconstructing an artifact-free image is higher by at least a factor $\pi/2$. Therefore, acceleration of the data acquisition is a special requirement for achieving a broad clinical acceptance of this radial technique.

In principal, it is possible to use parallel imaging techniques, like the above-mentioned GRAPPA, even in radial imaging, to reduce the acquisition periods. However, in non-Cartesian acquisition, usually a separate set of GRAPPA weight is required for each "missing" sample point. Provided that for each of these missing sample points, an appropriate densely measured coil calibration data set is available, the numerical quantity increases linearly with the number of unmeasured sample points which, in turn, is proportional to the total number of sample points on the grid.

From the abstract "Direct Parallel Imaging Reconstruction of Radially Sampled Data Using GRAPPA with Relative Shifts" by Mark Griswold et al., published in Proc. Intl. Soc. Mag. Reson. Med. 11 (2003) with the program number 2049, a method is known that reduces the numerical quantity compared to an exact GRAPPA reconstruction for a radial acquisition diagram. However, it is assumed that a radial grid within a concentric ring can be exchanged approximately with a Cartesian grid, making it possible to use a set of GRAPPA weights for all missing data points with the same or a similar radial distance from the k-space center. This simplified assumption can result in an incomplete development of, or increase in noise in, the reconstructed images, so such images cannot always be suitable for practical use.

SUMMARY OF THE INVENTION

An object of the present invention is to provide an improved method by which radial imaging can be accelerated and, at the same time, an exact method of calculating the raw data can be used.

In the inventive method of reconstructing raw data for producing magnetic resonance image data of an object under examination, raw data are provided that have been acquired, individually with multiple magnetic resonance coils (receiving coils) and entered at sample points on a grid in k-space, i.e., raw data acquired with a parallel imaging method. The grid is defined to ensure that the sample points are arranged on trajectories so that raw data for all sample points in k-space would already be sufficiently scanned with each individual magnetic resonance coil. This does not involve the use of a conventional Cartesian grid, but instead the arrangement of sample points is varied on the trajectories in so that the sample points are arranged, respectively, along a number of one-dimensional edges that each have an equidistant grid dimension that is characteristic for the respective edge. At least two different edges can have a different equidistant grid dimension that is characteristic for the respective edge, i.e., on a respective edge, the sample points are situated with respect to each other with the equidistant grid dimension allocated to that edge, but not necessarily in relation to sample points at a different edge, which has a different grid dimension. In particular, the grid dimension for edges located farther toward the outer periphery of k-space can have greater grid spacing than the grid dimension for edges located closer to the inside of k-space.

Preferably, to produce such a grid, scanning can be performed along trajectories extending radially through k-space, wherein the angle between two adjacent trajectories and the arrangement of sample points on a radial trajectory are varied depending on the angle, so that the sample points are respectively arranged along the desired one-dimensional edge in the equidistant grid dimension characteristic for that respective edge.

It is preferred for the grid to be defined so that the sample points are arranged with respect to each other along edges of preferably imaginary rectangles in an equidistant grid dimension characteristic for the respective edge. Especially with the preferred radial scanning process, the radial trajectories and the sample points on them can be arranged so that, when an edge of such an imaginary rectangle is put through a sample point, the further sample points on this edge are all situated to each other at the respective grid spacing. For this purpose, the distance between successive sample points along a radial trajectory (also called a spoke) is modified with the angle of the spoke. Because of the fact that the raw data are acquired along radial k-space trajectories, that each pass through the k-space center, there remains a similar insensitivity to movement as in conventional radial imaging methods. The subsequent description is based on this preferred embodiment, although the invention is not restricted to this example.

According to the invention, there are raw data that were acquired (entered at) only a portion of sample points, so that locally, in an internal region of k-space, sufficient scanning exists, and in an external region of k-space, localized undersampling exists. In this connection, the term "undersampling" is used in the usual manner according to the Nyquist theorem, according to which, in "sufficient" scanning, the distance between two sample points that are adjacent in one direction cannot be smaller than the reciprocal value of the extent of the field of view in this direction. Otherwise, undersampling exists.

In accordance with the invention, reconstruction of the missing raw data (the "missing" sample points due to undersampling) takes place according to the following steps:

i) Reconstruction of raw data for a respective specific magnetic resonance coil takes place on the missing sample points in the internal region, using the raw data acquired with this magnetic resonance coil on other sample points from the internal region. This reconstruction can be performed without using raw data acquired from other magnetic resonance coils because in this region complete scanning is provided and therefore all data at any point in this space can be (exactly) determined. Therefore, this reconstruction of raw data takes place separately for all magnetic resonance coils involved.

ii) Reconstruction of raw data for the respective specific magnetic resonance coil takes place on the missing sample points in the external region, using the raw data acquired for the internal region, as well as the raw data reconstructed in step i) and using raw data acquired with different magnetic resonance coils. This reconstruction of raw data extends across all magnetic resonance coils involved, including the specific magnetic resonance coil for which the current reconstruction of raw data is performed.

As subsequently shown, this procedure can be used to avoid the above-mentioned problem, namely that the exact calculations for raw data from parallel radial imaging are too time-consuming. The present invention provides an exact GRAPPA method of artifact-free image reconstruction of undersampled trajectory extending radially through the k-space. At the same time, the numeric effort increases (as subsequently shown) only in linear manner with the root of non-acquired sample points and is therefore smaller by one dimension than the numeric effort of a "normal" exact GRAPPA reconstruction of an undersampled radial trajectory, which usually increases in linear manner with the number of non-acquired sample points.

Correspondingly, in the inventive method of producing magnetic resonance image data of an object under examination, first a grid is defined in the manner described above. Subsequently, the raw data are acquired by operation of a magnetic resonance system with multiple magnetic resonance coils, wherein only on a portion of raw data sample points are acquired in the manner described, so that a specific complete scanning process is performed in an internal region of k-space, and in an external region of k-space, undersampling exists. According to the invention, reconstruction of missing raw data at non-sampled (unfilled) sample points proceeds with the above-described method of completing the raw data in k-space. A conventional algorithm can then be used to achieve a reconstruction of image data based on the completed raw data.

An inventive reconstruction device for reconstructing raw data to produce magnetic resonance image data of an object under examination has an interface for transferring the above-mentioned partially undersampled raw data, which were respectively acquired with multiple magnetic resonance coils at sample points on the grid in k-space. Furthermore, the reconstruction device has a first raw data reconstruction unit for reconstructing the missing raw data for a specific magnetic resonance coil at the non-sampled sample points in the internal region, using raw data acquired at different sample points with these magnetic resonance coils from the internal region, without using raw data that was acquired with different magnetic resonance coils. The reconstruction device has a second raw data reconstruction unit for reconstructing raw data for a specific magnetic resonance coil at the non-sampled sample points in the external region, using raw data acquired for the internal region, as well as raw data reconstructed by the first raw data reconstruction unit, and using raw data that was acquired with different magnetic resonance coils.

Moreover, to reconstruct image data on the basis of incomplete raw data, the reconstruction device can have a conventional image reconstruction unit. For example, this image reconstruction unit has an interface for transferring the completed raw data.

An inventive magnetic resonance system has the conventional components, for example, a basic field magnet, a radio frequency transmission device for emitting RF pulses, a gradient system for switching the required gradients, a radio frequency receiving device for receiving the magnetic resonance signals or for acquiring the raw data, as well as a control unit that is designed to emit RF pulses for performing a desired measurement and, for this purpose, switch (activate) in a coordinated manner the associated gradient pulses via the gradient system and to acquire the raw data via the radio frequency receiving device. In addition, the magnetic resonance system has a reconstruction device (described above), to reconstruct in the invention-based manner raw data for the desired sample points, which can then be used for image data reconstruction.

Basic components of the reconstruction device can be designed in the form of software components. In particular, this includes the first raw data reconstruction unit, the second raw data reconstruction unit and the image reconstruction unit. In the same way, the above-mentioned interfaces, for example, the raw data interface, can be designed at least partially in the form of software and can possibly access hardware interfaces of an available computer. Consequently, the invention also encompasses a non-transitory, computer-readable data storage medium encoded with programming instructions that can be directly loaded into the memory of a reconstruction device, including program code segments to process all steps of the invention-based method when the program is performed in the reconstruction device. Such software-based realization has the advantage that existing conventional reconstruction devices can be retrofitted by appropriately implementing the program, to quickly and optimally reconstruct missing raw data.

Preferably, the grid is defined (organized) so that the respective centers of the above-mentioned (imaginary) concentric rectangles are each located in k-space. In a preferred variation of the method, the grid is defined so that the concentric rectangles are squares, the center of each coinciding with the center of k-space. Such trajectories are also described as linogram trajectories. Originally, linograms were developed for computed tomography and were first described in the article "Linogram reconstruction for magnetic resonance imaging (MRI)" by Axel Leon et al., IEEE Transactions on Medical Imaging, volume 9, issue 4, 1990, pp. 447-449.

According to the invention, in a second step, a reconstruction of raw data for a magnetic resonance coil is performed on the missing sample points in the external region, using the raw data acquired for the internal region and the raw data previously reconstructed in the first step. For this purpose, preferably, based on the raw data acquired and reconstructed for the internal region, weighting factors for a linear combination of adjacent points are determined for reconstructing raw data at the non-sampled sample points in the external region (for example, GRAPPA weights). A procedure for determining such GRAPPA weights is described later. Preferably, the reconstruction device can has a weighting factor determining unit, in which these weighting factors can be determined.

Preferably, the reconstruction is performed in the internal region and/or in the external region separately for each edge of one of the rectangles to allow for an exact reconstruction of the missing sample points, while keeping the calculation effort as low as possible.

For the reconstruction of raw data in the internal region, it is preferred to perform a (known) SINC interpolation. For example, when reconstructing the raw data of an edge, a one-dimensional Fourier transformation with transformation length L of the raw data at the sample points into a hybrid space (which in one dimension/spatial direction, along which the one-dimensional Fourier transformation was performed, is in the image domain and in the other dimension/spatial direction is still in k-space) is performed, a replacement of the transformed values with additional hybrid space points with a value "0" to a total of $A \cdot L$ hybrid space points, and a subsequent inverse Fourier transformation with transformation length $A \cdot L$ from hybrid space back to k-space. This method result in an exact mathematical reconstruction of the missing sample points or their raw data.

To keep the calculation effort as low as possible, without abandoning the accuracy of the method, two sets of weighting factors, namely one for the two horizontal edges and one for the two vertical edges of the rectangle, preferably square, are determined for each of the concentric rectangles.

To determine the weighting factors based on the raw data acquired and reconstructed for the internal region, it is preferred to use "regridding". The term "regridding" refers to newly screening or reconstructing "virtual" sample points that are arranged to each other in a grid dimension that is different from the original sample points. In this way, for each edge to be reconstructed in the external region (i.e., an edge for which the raw data should be determined at the missing sample points) virtual sample points can be reconstructed for the already reconstructed internal region, which sample points are adjusted to the distances of the sample points on the respective edge to be reconstructed. According to the Nyquist theorem, this is also possible without sacrificing accuracy, because in the sufficiently scanned space the raw data for any sample point can be exactly calculated from the raw data of the other sample points. Preferably, separate regridding is performed for each set of weighting factors.

Preferably, a chirp-z-interpolation (also called chirp-z-transform) is performed for this regridding. In contrast to SINC interpolation, the chirp-z-transform allows for any real relationship between the grid dimension before and after regridding. Preferably, the chirp-z-transform is performed also by a one-dimensional Fourier back and forth transformations, as is subsequently explained in more detail in the context of the description regarding FIG. 5. This procedure again results in an exact mathematical reconstruction of the desired newly arranged sample points or their raw data.

DESCRIPTION OF THE PREFERRED EMBODIMENTS

In accordance with the previous explanations, a preferred embodiment of the invention, measured data in the form of undersampled linogram trajectory are acquired with the use of multiple receiving coils. "Undersampled" means that, based on a completely scanned linogram trajectory with M sample points per edge, only every A-th spoke is acquired with an acceleration factor A. Then, GRAPPA reconstruction is required to interpolate the non-acquired raw data at the missing sample points (subsequently also called "data points") from the acquired raw data at the other sample points and to substitute these in the data matrix. For this purpose, k-space is first divided into two regions, an internal (central) region and an external (peripheral) region, by a concentric square (the center of which corresponds with the center of the k-space) with an edge length M/A. This square forming the boundary of the regions is subsequently called a "Nyquist square". According to the Nyquist theorem, the internal region of the concentric square has been sufficiently scanned. Accordingly, missing data points of a specific receiving coil (subsequently also called "coil", for short) can be interpolated from the measured data points of these receiving coils. Preferably, interpolation takes place, independently for each edge of each concentric square, by an exact one-dimensional SINC interpolation. The calculation of non-acquired data points in the external region of the Nyquist square is also performed square-by-square. The horizontal and the vertical edges of a square are again processed independently of each other. However, in the edge-by-edge procession, the missing data points of a specific coil are calculated with a generalized GRAPPA reconstruction. For calibrating the GRAPPA reconstruction of a specific edge, the respective internal region of the Nyquist square is interpolated, for example by means of exact, quick chirp-z-transform, so that the distance of adjacent data points are corresponding with the grid spacing of the completed edge to be processed.

Figure 1:
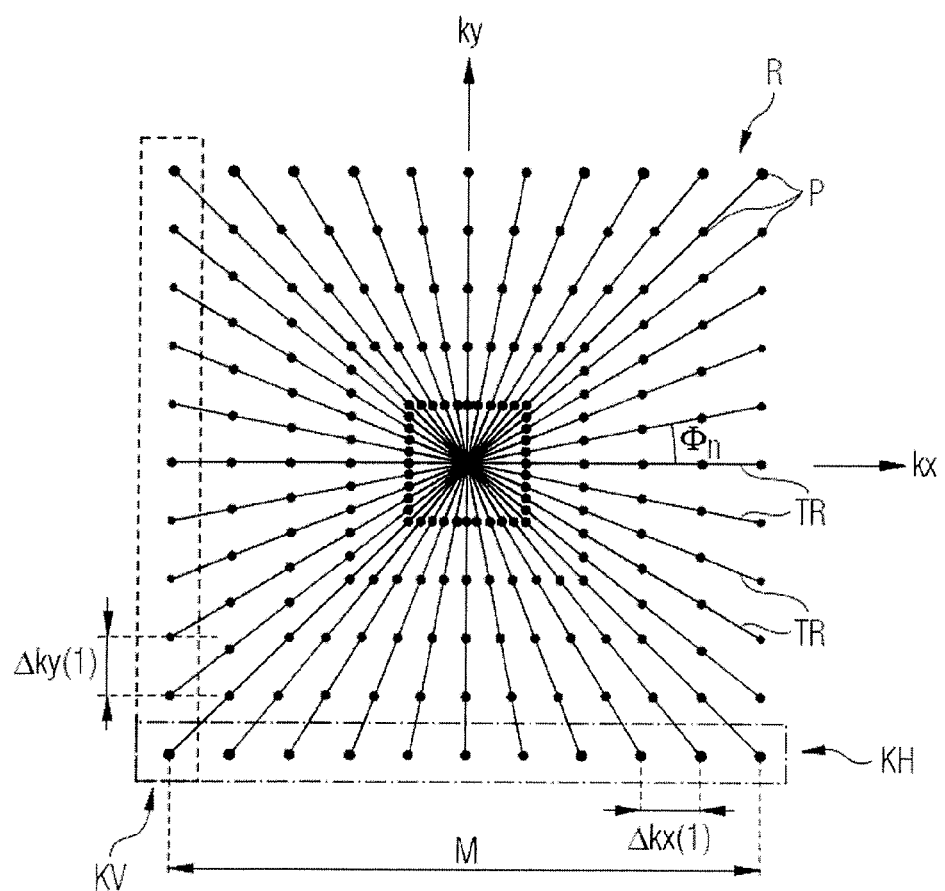
FIG. 1 schematically illustrates an embodiment of a completely scanned linogram trajectory on an x/y plane in k-space.

This process is subsequently described again in more detail by reference FIGS. 1 to 5:

FIG. 1 shows a two-dimensional, completely scanned linogram trajectory according to the prior art. In contrast to a real radial trajectory, the sample points P on such a (scanning) grid R are located on concentric squares KR around the center of k-space instead of on concentric circles. Usually, acquisition takes place in a manner similar to conventional, "real" radial trajectories along "spokes". Therefore, the spokes can also be described as radial trajectories TR. At the same time, the spokes TR involve lines (shown in FIG. 1 as continuous lines) which extend radially from one end of the k-space through the k-space center to the other end of the k-space. However, different from "real" radial trajectories, the difference angle between adjacent spokes TR is not constant. Instead, the angle φn of spoke n results from the following relationship:

$$\tan\Phi_n = \begin{cases} 4n/Ns - 1 & 0 \le n < Ns/2 \\ Ns/(3Ns - 4n) & \text{for } Ns/2 \le n < Ns \end{cases} \quad (4)$$

The angle of the spoke in the top line is defined relative to the horizontal axis, as shown in FIG. 1. The top line on the right side of equation (4) indicates the spokes counterclockwise with angles between −45 degrees included (n=0) and +45 degrees excluded (n==Ns/4). Ns is the number of the spokes TR, which is approximately twice as large as the number M of the sample points P per spoke TR:

$$Ns = 2 \cdot (M-1) \quad (5)$$

M is also the number of sample points per vertical or horizontal edge KV, KH of each concentric square KR, and thus also that of the external square. Of all edges KV, KH, these edges KV, KH of the external square respectively have the largest grid spacing (the grid spacing is the distance of directly adjacent sample points on an edge and is also described as grid dimension). The grid R is selected so that (according to the Nyquist theorem) even the outermost square is sufficiently scanned for the selected field of view. Therefore, the grid spacing of the external k-space column (i.e., along the vertical edge KV) or -line (i.e., along the horizontal edge KH) corresponds with the grid spacing of a conventional Cartesian trajectory. As a result, the number of grid points of the linogram trajectory (~2M²) is twice as large as the number of grid points of a conventionally scanned Cartesian trajectory (M²). Therefore, M is also described as matrix size of matrix, for short.

This fulfills the Nyquist theorem, provided the following applies to the (grid) spacing $\Delta k_y$ of adjacent sample points of a vertical edge KV:

$$\Delta k_y \le 1/FoV_y \quad (6)$$

or for the distance $\Delta k_x$ of two adjacent sample points of a horizontal edge KH:

$$\Delta k_x \le 1/FoV_x \quad (7)$$

In this case, $FoV_x$, $FoV_y$ are the vertical or horizontal edge lengths of a rectangle which completely incorporates the object to be measured. As a result, the image of the object I (x,y) is space limited. In addition, the discreet Fourier transformation of the object acquired in MR technology is inevitably bandlimited. The Nyquist theorem shows that a bandlimited can be perfectly reconstructed from their discreet sample points when these sample points are available with a constant spacing, which fulfill the requirements (6) or (7). On the grid shown in FIG. 1, it has been ensured that the requirements according to equations (6) and (7) are fulfilled for the outermost (l-th) square, i.e., the grid spacing $\Delta k_y(l)$, $\Delta k_x(l)$ on the edges KV, KH has been selected correspondingly. As a result, this applies also to all squares located further on the inside.

Figure 2:
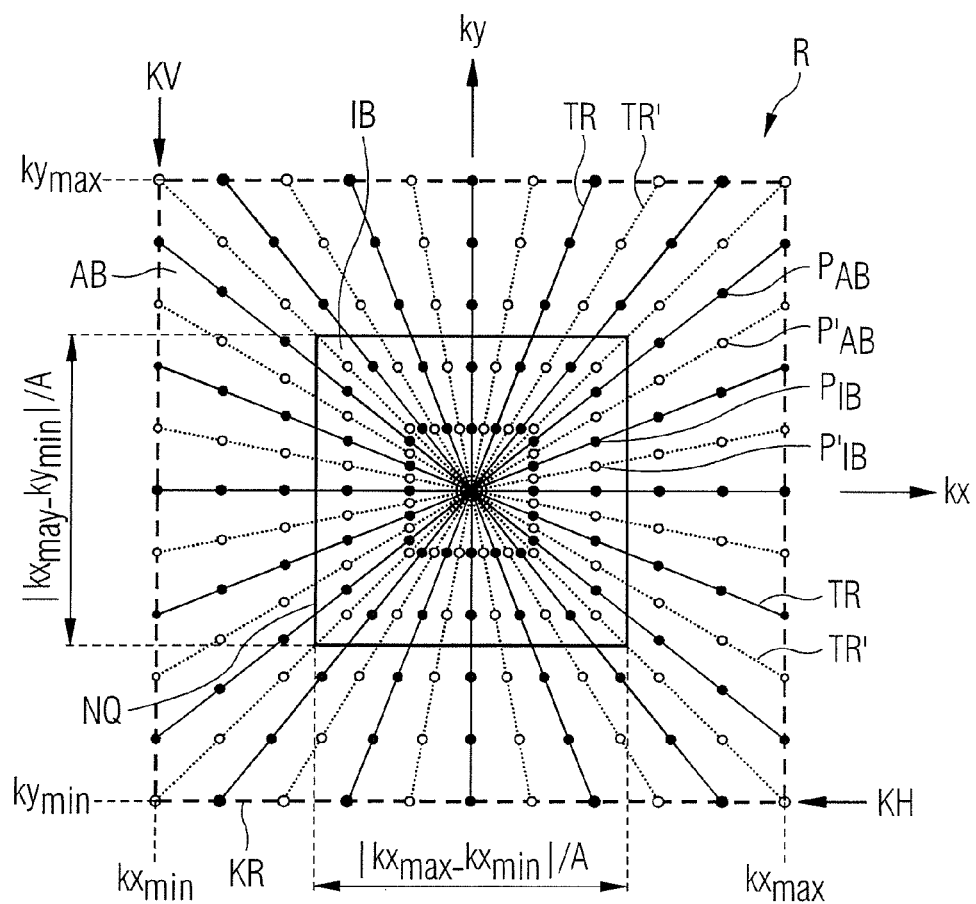
FIG. 2 shows the linogram trajectory according to FIG. 1, but undersampled with an acceleration factor A=2 (the open points are non-sampled sample points).

FIG. 2 shows the same grid that is shown in FIG. 1, but now as a undersampled linogram trajectory in that only the sample points P of each second spoke are measured. In FIG. 2, the unmeasured spokes TR' are depicted as dotted lines and the associated non-sampled data points $P_{IB}'$, $P_{AB}'$ as open points, the measured spokes TR are depicted as continuous lines and the associated sampled data points $P_{IB}$, $P_{AB}$ as closed points. Consequently, in this case, the acceleration factor A amounts to two. To be able to use the invention-based GRAPPA reconstruction, the acquired data should be acquired with at least A (that is, in FIG. 2, two) coil elements, the local sensitivity of which is sufficiently distinct. Then, it is the object of parallel image reconstruction to calculate the unmeasured data points $P_{IB}'$, $P_{AB}'$ from the measured data points $P_{IB}$, $P_{AB}$ of all coil elements and thus complete the raw data in the k-space. Subsequently, the images from the raw data can be reconstructed in the same manner as if all data points had been measured.

In FIG. 2, a concentric "Nyquist square" NQ is framed with a bold continuous line and has an edge length $|kx_{max} - kx_{min}|/A$. In the provided field of view, $kx_{max}$ and $kx_{min}$ are the maximum and minimum k-space coordinates in x direction, and $ky_{max}$ and $ky_{min}$ are the maximum and minimum k-space coordinates in y direction. Because it is a square, the grid spacings $\Delta k_y$, $\Delta k_x$ are the same in the x direction and the y direction. According to the Nyquist theorem, the data points in the internal region IB inside this Nyquist square NQ continue to be sufficiently scanned (even after "global" subsampling). This results from the assumption that the data points of the completely scanned external edge fulfill the Nyquist theorem and that the grid spacing $\Delta k_y$, $\Delta k_x$ on the edges KV, KH increases in linear manner with its distance from the k-space center. However, subsampling actually takes place in the external region AB.

Figure 3:
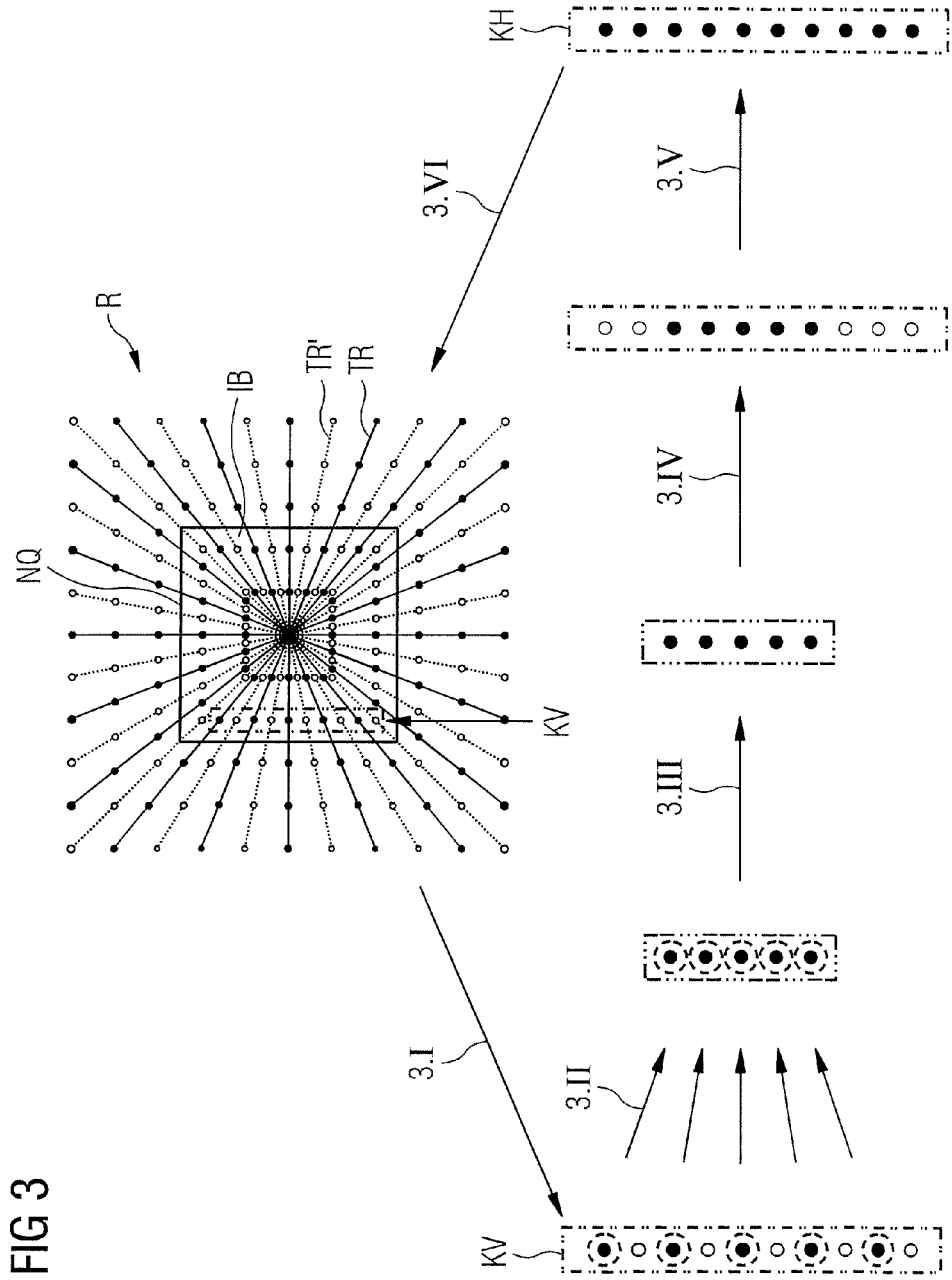
FIG. 3 schematically illustrates the method according to an embodiment of the invention for reconstructing the missing sample points in an internal region of the linogram trajectory according to FIG. 2.

FIG. 3 shows a flow chart for a possible completion of the sufficiently scanned internal region IB of the grid R or k-space (i.e., the region inside the Nyquist square NQ) from FIG. 2, using the example of a vertical edge KV. Because of the fact that the bandlimited hybrid space function can be completely reconstructed from the sample points, it is possible to calculate from the scanned data points $P_{IB}'$, $P_{AB}'$ the non-sampled data points $P_{IB}'$ (intermediate grid points) of the spectrum. In the present example, the especially efficient and exact SINC interpolation is used. The procession takes place independently for each edge KV, KH of each concentric square KR. For the horizontal edges KH, the method is performed in analogous manner.

Step 3.I:

Selection of a specific edge (in this case, the left vertical edge KV of the largest square inside the Nyquist square NQ). The edges for the procession are each defined so that they include only one of the two corner points, the other corner point is then attributed to the adjacent edge. In FIG. 3, the left lower corner point is attributed to the left vertical edge KV. The left upper corner point would be processed with the upper horizontal edge, etc., so that ultimately each corner point is considered once.

Step 3.II:

First, the scanned points of edge KV are sorted into a vector with the length TL1. At the same time, a first Fourier transformation length TL1 is selected, which is larger or equal to the number M/A of scanned points $P_{IB}'$ of the current edge:

$$TL1 \geq M/A. \qquad (8)$$

In the example used in FIG. 3, TL1=M/A has been selected. Furthermore, the convention is used that the DC term (with frequency "zero") is sorted into the center of the vector (i.e., on position TL1/2) and subsequently the positive frequency terms are sorted ascending to higher vector positions. The negative frequency terms are sorted descending to lower vector positions. If, in the case TL1>M/A, frequency terms remain empty, they have to be filled with zeros.

Step 3.III:

A quick one-dimensional discreet Fourier transformation with a transformation length TL1 takes place into the hybrid space.

Step 3.IV:

In the hybrid space, the data vector is extended in a so-called zero padding method to a vector length $$TL2 = A \cdot TL1 \qquad (9)$$

i.e., at the ends of the vector, vector elements with a data value "0" are simply added.

Step 3.V:

Now, an inverse fast Fourier transformation of the data vector with a transformation length TL2 takes place from hybrid space to k-space.

Step 3.VI:

After the back-transformation, the vector length amounts to the length TL2, the data points of which are all different from zero. The internal M−1 data points of the vector thus obtained substitute the M−1 data points of the selected edge in such a way that the DC term of the selected edge is substituted by the DC term at the position TL2/2 of the vector thus obtained. The completed raw data for the processed edge KV thus obtained can then be implemented again in the k-space matrix.

It should be noted that the data were acquired with multiple coils and therefore each edge exists $N_C$ times, wherein $N_C$ represents the total number of coils. In this case, the procession of data of different individual coils is performed completely independent of each other. Therefore, steps 3.I to 3.VI have to be repeated for each individual receiving coil.

Figure 4:
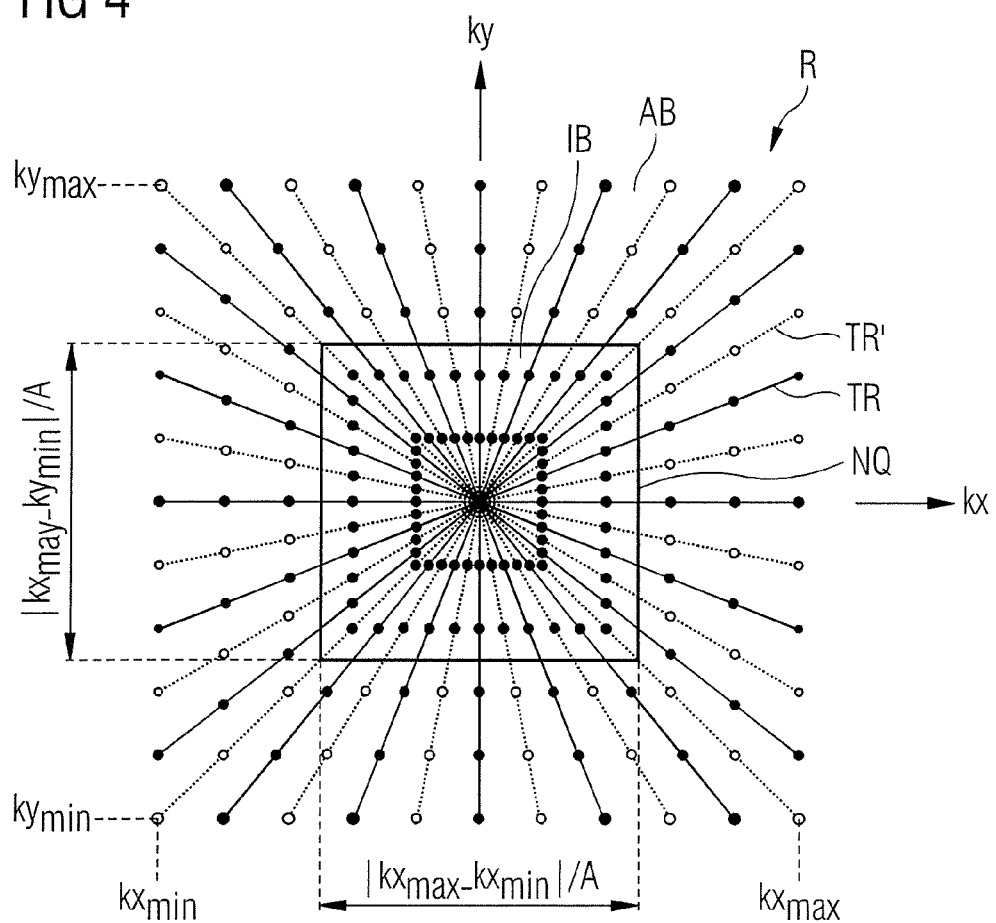
FIG. 4 shows the linogram trajectory according to FIG. 2 following a reconstruction of the missing sample points in the internal region.

FIG. 4 shows the k-space matrix, after steps 3.I to 3.VI according to FIG. 3 have been repeated for each edge KV, KH of each concentric square inside the Nyquist square NQ. Consequently, the data points in the internal region IB of the grid R, i.e., inside the Nyquist square NQ, are completely fulfilled as in a complete scanning process.

Figure 5:
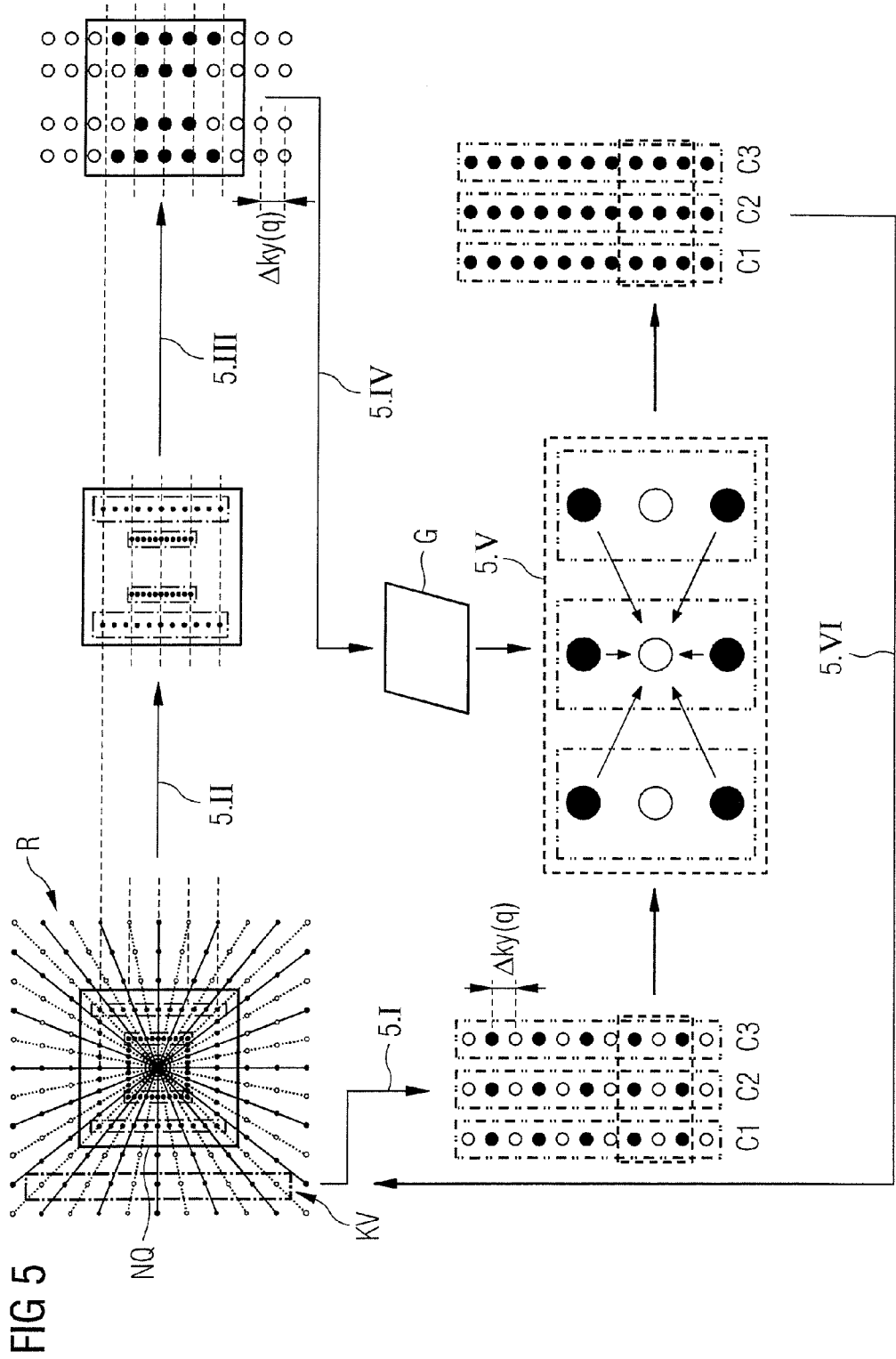
FIG. 5 schematically illustrates the method according to an embodiment of the invention for reconstructing the missing sample points in an external region of the linogram trajectory according to FIG. 4.

FIG. 5 illustrates the inventive completion of raw data of undersampled concentric squares, which are located in the peripheral region AB of the grid R or k-space (that is, outside the Nyquist square NQ) of FIG. 2, and which have an edge length larger than $|kx_{max}-kx_{min}|/A$.

The completion or determination of the non-sampled sample points $P_{AB}'$ is performed again edge-by-edge. Also in this case, the horizontal and vertical edges KH, KV of each uncompleted square are processed separately.

Subsequently, the preferred method according to the invention is described by means of the example of a vertical edge KV. Analogous statements can be applied to horizontal edges KH.

The grid spacing Δky(q) between the sample points of a vertical edge of a specific square q is equal.

When initially restricting the vicinity Ω in the (GRAPPA) equation (1) described above to adjacent sample points belonging to the same vertical edge KV of the square, it can be assumed that all non-acquired sample points $P_{AB}'$ of the respective edge KV have identical GRAPPA weights $n_{q,i}$. Consequently, the equation (3) is reduced to $$s_i(k_x, k_y) = \sum_{j=1}^{N_c} \sum_{l=0}^{N_y-1} n_{q,i}(j, l) s_j(k_x, k_y + (A1 - l_0)\Delta k_y(q)) \qquad (10)$$

At the same time, i is again the coil index, $N_c$ is the number of coil elements, A is the already implemented acceleration factor, $N_y$ is the number of the next neighboring sample points considered. $l_0$ is again selected in such a way that all sample points on the right side were measured and involve neighboring sample points of $s_i$. It should also be noted that the coordinate $k_x$ is equal for all data points of a vertical edge KV of a specific square q.

Like in Cartesian MR imaging, the initially unknown linear GRAPPA weights $n_{q,i}$ could be calculated with the solution of a linear equation system, provided a sufficient number of completely scanned data points with vertical grid spacing $\Delta k_y(q)$ (the so-called coil calibration data) is available.

As noted above, "sufficient" means that at least as many linear equations can be made as there are unknown GRAPPA coefficients $n_{q,i}$. The GRAPPA coefficients $n_{q,i}$ per component coil i (in this context, a component coil simply refers to one of the Nc coils) amount to $$N_{unknown} = N_c \cdot N_y \qquad (11)$$

Initially, such a set of sufficiently scanned column vectors with grid spacing Δky(q) is not available. However, the sufficiently scanned column vectors of the concentric squares, which are located inside the Nyquist square NQ (with edge length $|kx_{max}-kx_{min}|/A$) are already existing because f the previous completion of the data matrix of the internal region IB.

According to the Nyquist criterion, the bandlimited hybrid space function can be completely reconstructed from the sample points. In particular, it is possible to produce the hybrid space function at the grid points of a grid with grid spacing $1/\Delta k_y(q)$. Its spectrum (produced by the inverse discreet Fourier transformation) shows the desired grid spacing $\Delta k_y(q)$. Therefore, the coil calibration data set for the vertical edges of the q-th square is produced by regridding the columns inside the Nyquist square NQ with target grid spacing $\Delta k_y(q)$.

Instead of the SINC interpolation with two quick discreet one-dimensional Fourier transformations (which allows only for a rational relationship between the original grid spacing and the target grid spacing) described in the context of FIG. 3, preferably (but not necessarily required) interpolation with a one-dimensional chirp-z-transformation is now performed:

The hybrid space function (discreet Fourier transformation) $q_n = \{q_0, \ldots, q_{M-1}\}$ of a one-dimensional k-space vector $s_k=\{s_0, \ldots, s_{M-1}\}$ of M uniformly scanned k-space signals is (as is generally known) defined as follows:

$$q_n = \sum_{k=0}^{M-1} s_k e^{2\pi i k n/M}, n = 0, \ldots, M-1 \quad (12)$$

The chirp-z-transformation generalizes this formula to $$q_n = \sum_{k=0}^{M-1} s_k e^{2\pi i k n/M}, n = 0, \ldots, M-1 \quad (12)$$

wherein $\alpha$ can refer to any real number. Therefore, the factor $\alpha$ substitutes the factor $1/M$ and thus allows for regridding with any grid spacing by means of an analogous procedure, as described in the context of SINC interpolation and FIG. 3.

By the substitution $2kn=k^2+n^2-(n-k)^2$, equation (13) can also be written as follows:

$$\tilde{q}_n(\alpha) = e^{\pi i n^2 \alpha} \sum_{k=0}^{M-1} y_k z_{n-k}, n = 0, \ldots, M-1, \quad (14)$$

with $$y_k = s_k e^{\pi i k^2 \alpha} \quad (15)$$

and $$z_k = e^{-\pi i k^2 \alpha} \quad (16)$$

The summation in equation (14) is a discreet convolution of the two discreet vectors $y_k$ and $z_k$ of length M defined in equations (15) and (16). Such convolution can be efficiently calculated in the Co domain with the product of the Fourier transformation, that is, with:

$$\tilde{q}_n(\alpha) = F^{-1}\{F(y_k) \cdot F(z_k)\} \quad (17)$$

The transformation length in equation (17) has to be at least $p \geq 2M$, because the succession $z_k$ is not periodical, i.e., ($z_{n-k} \neq z_{n-k+m}$).

The high frequency entries of vectors $y_k$ and $z_k$ have to be respectively filled with zeros up to length p.

After regridding the sufficiently scanned column vectors, an entire set of column vectors with the desired grid spacing $\Delta k_y(q)$ is available. This set consists of (M−1)/A column vectors (M represents the matrix size). This is shown in FIG. 2. Altogether, the linogram trajectory (M−1/2 has concentric squares, wherein (M−1)/2A has been completely scanned by them. Each of these completely scanned squares, in turn, has two horizontal edges.

For the completely scanned k-space regions of these (M−1)/A column vectors, the signal values $S_i(k_x, k_y)$ are known on the left, as well as on the right side of equation (10). As a result, they can be used for establishing a linear equation system where the only unknown quantity is the $N_{unknown}$ GRAPPA weights. In general, the number of equations is larger than $N_{unknown}$ and the GRAPPA weights are solved in terms of the least square sense. For this purpose, a number of efficient routines or solvers are available. As indicated by index i in equation (10), different component coils have different GRAPPA weights $n_{q,i}$. Therefore, $N_C$ equation systems have to be solved for each vertical or horizontal edge pair.

As soon as the GRAPPA weights for column vector q are known, the vector can be completed with the use of equation (10). It has to be noted that the GRAPPA weights for the two column vectors of a concentric square are identical, because the grid spacing $\Delta k_y$ is equal.

FIG. 5 has a graphic representation of the completion of data for a vertical edge KV (column) just described:

First, in step 5.I, an incompletely scanned vertical edge KV (which subsequently has index q) with grid spacing $\Delta k_y(q)$ is selected. The data of each column vector are acquired with all $N_C$ coil elements. In the example of FIG. 5, there are three different coil elements C1, C2, C3 (therefore, in this case $N_C=3$).

In step 5.II, all or a portion of the sufficiently scanned column vectors of the internal region IB are selected (optionally in several sub-steps).

In step 5.III, regridding of the column vectors of the internal region IB to the target grid spacing $\Delta k_y(q)$ takes place, for example, by the chirp-z-transformation described above. After regridding, the data in FIG. 5 are recorded in vectors of length M with target grid spacing $\Delta k_y(q)$. In this connection, it should be mentioned that only the lower frequency terms of these vectors are different from zero (in FIG. 5 represented by closed points), because naturally regridding does not change the k-space extension of the vector. Even the data of the edges of the internal region IB was naturally acquired with all $N_C$ coil elements. However, for drawing-related reasons, all $N_C$ coil channels of the completely scanned edges in step 5.II and step 5.III are respectively represented only by a single vector.

After regridding, the column vectors of the internal region IB in step 5.IV are used as coil calibration data for calculating the GRAPPS weights G. In methods in which the coil calibration data do not have to be measured separately (like in this case), the process is called self-calibration.

After the GRAPPA weights G for the column vector q are known, it can be completed in step 5.V with the use of equation (10), i.e., the missing raw data can be calculated at the unmeasured sample points of this vector. Because of the fact that the GRAPPA weights G for the two column vectors of a specific concentric square q are identical, and the grid spacing $\Delta k_y(q)$ is equal, it is possible to complete also the second vertical edge of the square q.

In step 6, the completed vectors (edges KV) are substituted in the original data set.

Subsequently, the next incompletely acquired edge is selected, which has not yet been processed, and these edge steps 5.I to 5.VI are repeated. The completion of the horizontal edges is performed in completely analogous manner. In particular, the horizontal edges KH of the sufficiently scanned concentric squares inside the Nyquist square NQ are regridded for calculating the GRAPPA weights.

After the procession of all insufficiently scanned edges KH, KV, the data matrix is completely allocated.

The remaining reconstruction steps are identical with the image reconstruction in a complete data acquisition. For this purpose, multiple methods are available, as described, for example, in the article "A Dual Approach to Linogram Imaging for MRI" by Neville Gai and Leon Axel in MRM 38, 1997, pp. 337 to 341, and its references.

Figure 6:
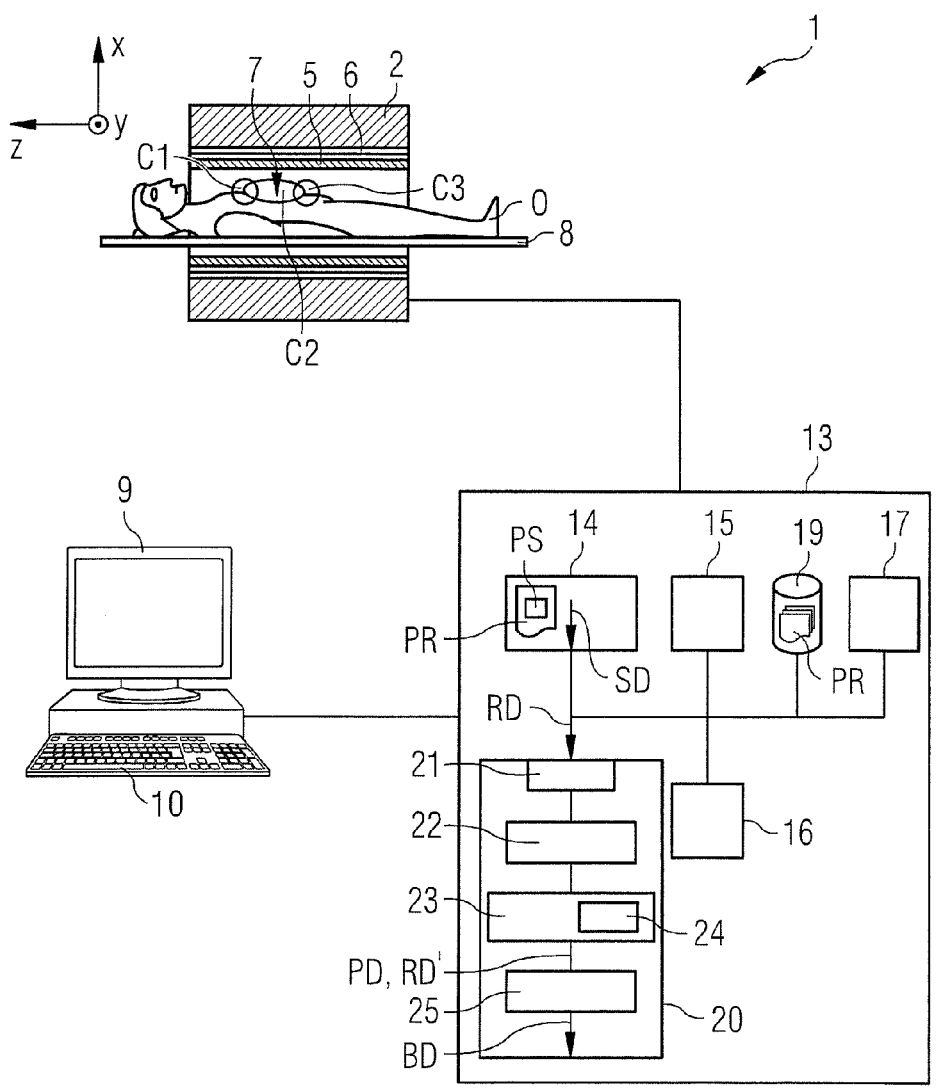
FIG. 6 schematically illustrates a magnetic resonance system constructed and operating according to the invention.

FIG. 6 shows a block diagram of a magnetic resonance (MR) imaging system 1, which is designed to perform the method described above. The system includes the actual magnetic resonance scanner 2, including an examination space 3 or a patient tunnel, into which an object under examination O, in this case a patient or test person (in whose body the object under examination, for example a specific organ, is located) is moved while laying on a bed 8.

The magnetic resonance scanner 2 is provided in the usual manner with a base field magnetic system 4, a gradient system 6, as well as an RF receiving antenna system 7. In the embodiment shown, the RF transmitting antenna system 5 is a whole-body coil permanently installed in the magnetic resonance scanner 2. The RF receiving antenna system 7 has receiving coils C1, C2, C3 that are placed on the patient or test person (in FIG. 6, this is illustrated by three receiving coils C1, C2, C3, usually it involves multiple coils). In most cases, the receiving coils C1, C2, C3 are grouped in units with a mutual housing, often referred to as local coils. It is also possible to use the whole-body coil as an RF receiving antenna system and the local coils as RF transmitting antenna system, provided these coils can be switched to different operating modes. For the inventive method, it is important that multiple receiving coils are available for parallel data acquisition.

Here, the base field magnetic system 4 is designed in the usual manner so that it produces a basic magnetic field in longitudinal direction of the patient, i.e., the longitudinal direction extending along the z direction of the magnetic resonance scanner 2. The gradient system 6 has, in the usual manner, individually controllable gradient coils, so as to be able to activate gradients in x, y or z directions independently of each other.

The MR system shown in FIG. 6 is a whole-body system with a patient tunnel into which a patient can be completely inserted. It is also possible to use the invention on different MR systems, for example, with a laterally open, C-shaped housing, in particular also with smaller magnetic resonance scanners in which, for example, only a body part can be positioned.

Furthermore, the MR system 1 has a central control unit 13, which is used to control the MR system 1. This central control unit 13 comprises a sequence controller 14 for measurement sequence control. This is used to control the sequence of high frequency pulses (RF pulses) and gradient pulses, depending on a selected pulse sequence PS or a sequence of multiple pulse sequences for receiving multiple layers or volumes in a relevant volume range of the object under examination within a measuring session. For example, such a pulse sequence PS can be predetermined or parameterized within a measurement or control protocol PR. Usually, different control protocols PR are stored in a memory 19 for different measurements or measuring sessions and can be selected by an operator (and optionally changed, if required) and then used for performing the measurement. In the present case, a pulse sequence is selected so that parallel with multiple receiving coils raw data are acquired undersampled on the desired screen.

To emit the individual RF pulses of a pulse sequence PS, the central control unit 13 has a radio frequency transmission device 15 that produces and amplifies the RF pulses and supplies them via an appropriate interface (not shown in detail) to the RF transmitting antenna system 5. To control the gradient coils of the gradient system 6, to appropriately switch the gradient pulses according to the predetermined pulse sequence, the control unit 13 has a gradient system interface 16. For performing the pulse sequences, the sequence controller 14 communicates in an appropriate manner, for example, by transmitting sequence control data SD, with the high frequency transmission device 15 and the gradient system interface 16. In addition, the control unit 13 has a radio frequency receiving device 17 (which also communicates appropriately with the sequence controller 14) to receive in an coordinated manner within the readout windows predetermined by the pulse sequence PS magnetic resonance signals by the RF receiving antenna system 7 and to acquire the raw data RD after demodulation and digitalization.

At a raw data interface 21, a reconstruction device 20 receives the acquired raw data RD and reconstructs from them image data BD for the desired field of view. Usually, this reconstruction is also performed based on parameters that are predetermined in the respective measurement protocol.

In the present case, the reconstruction device 20 is designed in such a way that it can operate in accordance with the invention-based method.

For this purpose, it has a first raw data reconstruction unit 22 where the reconstruction of the missing raw data RD' is performed at the non-sampled sample points $P_{IB}'$ in the internal region IB of the Nyquist square NQ, as described above by means of FIG. 3.

The reconstruction device 20 has a second raw data reconstruction unit 23 for reconstructing the raw data RD' at the non-sampled sample points $P_{IB}'$ in the external region AB of the Nyquist square NQ, as described above by reference to FIG. 5. For example, the second raw data reconstruction unit 23 can have a weighting factor determining unit 24 with a regridding unit (not shown), to determine the GRAPPA weights G based on the completed raw data in the internal region IB, as described above.

Furthermore, the reconstruction device 20 comprises also an image reconstruction unit 25 in which, in the above-mentioned manner, image data can be reconstructed based on the completed raw data RD, RD'. For example, these image data can be stored in a memory 19, shown on an appropriate display and/or transmitted via a network.

The central control unit 13 can be operated via a terminal which has an input unit 10 and a display device 9, by means of which it is even possible to operate the entire MR system 1 by one operator. On the display device 9, also MR images can be displayed, and by means of the input unit 10, optionally in combination with the display device 9, measurements can be planned and started. In particular, it is possible to select and optionally modify control protocols PR with appropriate pulse sequences PS, as described above.

In addition, the invention-based MR system 1 and especially the control unit 13 can comprise a plurality of further components (not shown in detail), which are usually available on such systems, for example, a network interface to connect the entire system with a network and to be able to exchange raw data and/or image data or parameter cards, as well as further data, for example, patient-relevant data or control protocols.

The present invention provides an exact GRAPPA method for artifact-free image reconstruction of a undersampled linogram trajectory. At the same time, the numerical effort is increased in linear manner only with the number of concentric squares and thus with the root of the non-acquired sample points in the k-space. This is a dramatic performance gain, namely by a complete dimension compared to an exact GRAPPA reconstruction of a conventional radial trajectory, in which the number of GRAPPA reconstructions is increased in linear manner with the number of non-acquired data points. At the same time, the method profits from the general advantages of radial imaging, in particular the reduced sensitivity toward movement resulting from repeated acquisition of the central k-space regions while, at the same time, decreasing the main disadvantage of conventional radial imaging, that of extended acquisition periods.

In addition, in the invention-based method, it is possible to achieve a reduction of the acquisition period by a factor A compared to a completely scanned linogram trajectory by measuring only every A-th spoke. At the same time, the method involves self-calibration. This means that the sufficiently scanned coil calibration data required for calculating the weighting factors do not have to be acquired separately (as in Cartesian trajectory), but can be extracted directly from the sub-sampled linogram trajectory. This results in further saving of time.

It is not required to make simplifying assumptions, but it is possible to perform exact mathematical calculations. Therefore, it can be assumed that the exact reconstruction is manifested in fewer remaining artifacts, such a streaking, and an improved signal-to-noise ratio in the reconstructed images.

In conclusion, it should be noted again that the detailed methods and devices involve merely embodiments, leaving an expert with a large margin for applying the basic principle without leaving the invention, provided it is predefined by the claims. For example, the reconstruction device could be implemented on the terminal instead of the controller 10, or it could be implemented on a separate computer system which is connected via the network NW with the magnetic resonance system 1. Also the directions in the space could be positioned differently, for example, the x and y direction could be switched. The method can also be used in an analogous manner in a three-dimensional k-space or hybrid and image space. For completeness, it should also be noted that the use of the indefinite article "a" or "an" does not exclude that the respective feature could be available multiple times. In the same manner, the term "unit" does not exclude that it consists of multiple components which could possibly be spatially distributed.

I claim as my invention:

1. A method for reconstructing raw data, acquired from an object with a magnetic resonance apparatus, comprising:
   providing raw data to a computer, said raw data having been acquired with multiple magnetic resonance coils and, via said computer, entering said raw data into an electronic memory, organized as k-space, along trajectories comprised of respective sample points of a grid, and defining said grid such that, when raw data are entered at all sample points, k-space would be completely scanned, and varying said trajectories when entering said raw data to cause said raw data to be entered at sample points respectively along one-dimensional edges, with sample points in respective edges having an equidistant grid spacing that is characteristic for that respective edge;
   entering the raw data into said memory only at a portion of said sample points, and thereby causing Nyquist-sufficient scanning to exist only in a central region of k-space and causing Nyquist undersampling to exist in a peripheral region of k-space, thereby causing raw data to be missing at sample points in k-space that were not filled with said raw data;
   in said computer, for each of said multiple magnetic resonance coils, calculating the missing raw data in said central region using raw data acquired with the respective magnetic resonance coil and entered at other sample points in said central region, without using raw data acquired from others of said multiple magnetic resonance coils, and calculating the missing raw data in said peripheral region using the raw data entered in the central region and the calculated missing raw data from the central region, and using raw data acquired from magnetic resonance coils among said multiple magnetic resonance coils other than said respective magnetic resonance coil; and
   from said computer, making the calculated missing raw data available in electronic form, in a data file together with the other raw data entered into k-space, in a form suitable for further processing of said data file to reconstruct an image of said object.

2. A method as claimed in claim 1 comprising entering said raw data at said sample points in said grid in k-space along radial trajectories, with a non-zero angle between each two adjacent radial trajectories, with the sample points along each radial trajectory being varied dependent on said angle that causes the sample points to be filled with raw data along said one-dimensional edges at said equidistant grid dimension that is characteristic for the respective edge.

3. A method as claimed in claim 1 comprising defining said grid to cause said sample points to be situated along edges of concentric rectangles at said equidistant grid dimension that is characteristic for the respective edge.

4. A method as claimed in claim 3 wherein said rectangles are squares.

5. A method as claimed in claim 1 comprising, in said computer, determining weighting factors, for calculating said missing data in said peripheral region, using the calculated missing data in said central region and the raw data entered in the central region.

6. A method as claimed in claim 5 comprising determining two sets of said weighting factors respectively for each of said rectangles.

7. A method as claimed in claim 5 comprising determining said weighting factors by regridding said raw data entered in said central region and the calculated missing data in said central region.

8. A method as claimed in claim 7 comprising regridding said calculated and entered data in said internal region using a chirp-z interpolation.

9. A method as claimed in claim 1 comprising, in said computer, calculating said missing data in at least one of said central region and said peripheral region separately for each edge.

10. A method as claimed in claim 1 comprising calculating said missing raw data in said central region using a SINC interpolation.

11. A method to generate image data of an object, comprising:
   providing raw data to a computer, said raw data having been acquired with multiple magnetic resonance coils and, via said computer, entering said raw data into an electronic memory, organized as k-space, along trajectories comprised of respective sample points of a grid, and defining said grid such that, when raw data are entered at all sample points, k-space would be completely scanned, and varying said trajectories when entering said raw data to cause said raw data to be entered at sample points respectively along one-dimensional edges, with said sample points in respective edges having equidistant grid spacing that is characteristic for that respective edge;
   entering the raw data into said memory only at a portion of said sample points and thereby making Nyquist-sufficient scanning to exist only in a central region of k-space and to make Nyquist undersampling exist in a peripheral region of k-space, thereby causing raw data to be missing at sample points in k-space that were not filled with said raw data;
   in said computer, for each of said multiple magnetic resonance coils, calculating the missing raw data in said central region using raw data acquired with the respective magnetic resonance coil and entered at other sample points in said central region, without using raw data acquired from others of said multiple magnetic resonance coils, and calculating the missing raw data in said peripheral region using the raw data entered in the central region and the calculated missing raw data from the central region, and using raw data acquired from magnetic resonance coils among said multiple magnetic resonance coils other than said respective magnetic resonance coil; and in said computer, using the calculated missing raw data available, together with the other raw data entered into k-space, to reconstruct an image of said object, and making said image available in electronic form as a data file at an output of said computer.

12. A reconstruction device for reconstructing magnetic resonance raw data acquired from an object, comprising:

an input interface that receives raw data acquired with multiple magnetic resonance coils;

a computer in communication with said input interface;

an electronic memory comprising a grid of sample points organized as k-space;

said computer being configured to enter said raw data into said electronic memory, along trajectories comprised of respective sample points of said grid, with said grid being defined such that, when raw data are entered at all sample points, k-space would be completely scanned, and said computer being configured to vary said trajectories when entering said raw data to cause said raw data to be entered at sample points respectively along one-dimensional edges, with sample points on respective edges having an equidistant grid spacing that is characteristic for that respective edge;

said computer being configured to enter the raw data into said memory only at a portion of said sample points, and thereby causing Nyquist-sufficient scanning to exist only in central region of k-space and causing Nyquist undersampling to exist in a peripheral region of k-space, thereby causing raw data to be missing at sample points in k-space that were not filled with said raw data;

said computer being configured, for each of said multiple magnetic resonance coils, to calculate the missing raw data in said central region using raw data acquired with the respective magnetic resonance coil and entered at other sample points in said central region, without using raw data acquired from others of said multiple magnetic resonance coils, and to calculate the missing raw data in said peripheral region using the raw data entered in the central region and the calculated missing raw data from the central region, and using raw data acquired from magnetic resonance coils among said multiple magnetic resonance coils other than said respective magnetic resonance coil;

an output interface in communication with said computer; and said computer being configured, via said output interface, to emit the calculated missing raw data available in electronic form, in a data file together with the other raw data entered into k-space, in a form suitable for further processing of said data file to reconstruct an image of said object.

13. A reconstruction device for reconstructing magnetic resonance raw data acquired from an object, to produce magnetic resonance image data of the object, comprising:

an input interface that receives raw data acquired with multiple magnetic resonance coils;

a computer in communication with said input interface;

an electronic memory comprising a grid of sample points organized as k-space;

said computer being configured to enter said raw data into said electronic memory, along trajectories comprised of respective sample points of said grid, with said grid being defined such that, when raw data are entered at all sample points, k-space would be completely scanned, and said computer being configured to vary said trajectories when entering said raw data to cause said raw data to be entered at sample points respectively along one-dimensional edges, with sample points in respective edges having an equidistant grid spacings that is characteristic for the respective edge;

said computer being configured to enter the raw data into said memory only at a portion of said sample points, and thereby causing Nyquist-sufficient scanning to exist only in a central region of k-space and causing Nyquist undersampling to exist in a peripheral region of k-space, thereby causing raw data to be missing at sample points in k-space that were not filled with said raw data;

said computer being configured, for each of said multiple magnetic resonance coils, to calculate the missing raw data in said central region using raw data acquired with the respective magnetic resonance coil and entered at other sample points in said central region, without using raw data acquired from others of said multiple magnetic resonance coils, and to calculate missing raw data in said central region using the raw data entered in the central region and the calculated missing raw data from the internal region for the respective magnetic resonance coil, and using raw data acquired from magnetic resonance coils among said multiple magnetic resonance coils other than said respective magnetic resonance coil;

an output interface in communication with said computer; and said computer being configured to use the calculated missing raw data together with the other raw data entered into k-space, to reconstruct an image of said object, and to emit said image in electronic form, as a data file, via said output interface.

14. A magnetic resonance apparatus comprising:

a magnetic resonance data acquisition unit comprising multiple magnetic resonance coils;

an electronic memory comprising a grid of sample points organized as k-space;

a computer configured to operate said magnetic resonance data acquisition unit to acquire raw data with said multiple magnetic resonance coils and to enter said raw data into said electronic memory along trajectories comprised of respective sample points of said grid, said grid being defined such that, when raw data are entered at all sample points, k-space would be completely scanned, and said computer being configured to vary said trajectories when entering said raw data, to cause said raw data to be entered at sample points respectively along one-dimensional edges, with sample points in respective edges having an equidistant grid spacing that is characteristic for that respective edge;

said computer being configured to enter the raw data into said memory only at a portion of said sample points, and thereby causing Nyquist-sufficient scanning to exist only in a central region of k-space and causing Nyquist undersampling to exist in a peripheral region of k-space, thereby causing raw data to be missing at sample points in k-space that were not filled with said raw data;

said computer being configured, for each of said multiple magnetic resonance coils, to calculate the missing raw data in said central region using raw data acquired with the respective magnetic resonance coil and entered at other sample points in said central region, without using raw data acquired from others of said multiple magnetic resonance coils, and to calculate missing raw data in said peripheral region using the raw data entered in the central region and the calculated missing raw data from the central region, and using raw data acquired from magnetic resonance coils among said multiple magnetic resonance coils other than said respective magnetic resonance coil; and said computer being configured to make the calculated missing raw data available in electronic form, in a data file together with the other raw data entered into k-space, in a form suitable for further processing of said data file to reconstruct an image of said object.

15. A non-transitory, computer-readable data storage medium encoded with programming instructions, said storage medium being loaded into a computerized control and evaluation system of a magnetic resonance apparatus, and said programming instructions causing said computerized control and processing system to:

receive raw data having been acquired with multiple magnetic resonance coils, and said raw data into an electronic memory, organized as k-space, along trajectories comprised of respective sample points of a grid, and defining said grid such that, when raw data are entered at all sample points, k-space would be completely scanned, and varying said trajectories when entering said raw data to cause said raw data to be entered at sample points respectively along one-dimensional edges, with sample points in respective edges having an equidistant grid spacing that is characteristic for the respective edge;

enter the raw data into said memory only at a portion of said sample points, and thereby causing Nyquist-sufficient scanning to exist only in a central region of k-space and causing Nyquist undersampling to exist in a peripheral region of k-space, thereby causing raw data to be missing at sample points in k-space that were not filled with said raw data;

for each of said multiple magnetic resonance coils, calculate the missing raw data in said central region using raw data acquired with the respective magnetic resonance coil and entered at other sample points in said central region, without using raw data acquired from others of said multiple magnetic resonance coils, and calculate missing raw data in said peripheral region using the raw data acquired for the respective magnetic resonance coil and entered in the central region and the calculated missing raw data from the central region for the respective magnetic resonance coil, and using raw data acquired from magnetic resonance coils among said multiple magnetic resonance coils other than said respective magnetic resonance coil; and make the calculated missing raw data available in electronic form, in a data file together with the other raw data entered into k-space, in a form suitable for further processing of said data file to reconstruct an image of said object.

* * * * *